(12) United States Patent
Matsuo et al.

(10) Patent No.: US 9,881,815 B2
(45) Date of Patent: Jan. 30, 2018

(54) SUBSTRATE CLEANING METHOD, SUBSTRATE CLEANING DEVICE, AND VACUUM PROCESSING DEVICE

(71) Applicants: TOKYO ELECTRON LIMITED, Tokyo (JP); Kyoto University, Kyoto (JP)

(72) Inventors: Jiro Matsuo, Kyoto (JP); Toshio Seki, Kyoto (JP); Takaaki Aoki, Kyoto (JP); Kazuya Dobashi, Yamanashi (JP); Kensuke Inai, Yamanashi (JP); Misako Saito, Yamanashi (JP)

(73) Assignees: Tokyo Electron Limited, Tokyo (JP); Kyoto University, Kyoto (JP)

( * ) Notice: Subject to any disclaimer, the term of this patent is extended or adjusted under 35 U.S.C. 154(b) by 100 days.

(21) Appl. No.: 14/380,705

(22) PCT Filed: Feb. 25, 2013

(86) PCT No.: PCT/JP2013/001046
§ 371 (c)(1),
(2) Date: Aug. 22, 2014

(87) PCT Pub. No.: WO2013/128870
PCT Pub. Date: Sep. 6, 2013

(65) Prior Publication Data
US 2015/0007858 A1    Jan. 8, 2015

(30) Foreign Application Priority Data

Feb. 27, 2012 (JP) .................................. 2012-040647

(51) Int. Cl.
*B08B 5/00* (2006.01)
*H01L 21/67* (2006.01)
(Continued)

(52) U.S. Cl.
CPC .. *H01L 21/67028* (2013.01); *H01L 21/02046* (2013.01); *H01L 21/02063* (2013.01); *H01L 21/67023* (2013.01); *H01L 22/12* (2013.01)

(58) Field of Classification Search
CPC combination set(s) only.
See application file for complete search history.

(56) References Cited

U.S. PATENT DOCUMENTS

| 5,512,106 A | * | 4/1996 | Tamai | ....................... B08B 7/00 134/2 |
| 6,024,105 A | * | 2/2000 | Hanazaki | ............ C23C 16/4407 134/1.3 |

(Continued)

FOREIGN PATENT DOCUMENTS

| CN | 1221976 A | 7/1999 |
| JP | H04-155825 | 5/1992 |

(Continued)

OTHER PUBLICATIONS

Inoue Takashi, Cleaning Method for Solid Surface, Abstract for JPH04-155825; May 28, 1992; http://www.19.ipdl.inpit.gp.jp.
(Continued)

*Primary Examiner* — Sharidan Carrillo

(57) ABSTRACT

A substrate cleaning method for removing particles adhered to a substrate includes: acquiring particle information including diameters of the particles adhered to the substrate; controlling, based on the acquired particle information, a factor related to sizes of gas clusters having aggregates of atoms or molecules of a cleaning gas; ejecting the cleaning gas, at a higher pressure than a processing atmosphere where the substrate is provided, to the processing atmosphere and generating the gas clusters by adiabatic expansion; and removing the particles by irradiating the gas clusters in a perpendicular direction to a surface of the substrate. As a result, even if recesses for a circuit pattern are formed on the (Continued)

surface of the substrate, the particles in the recesses can be removed at a high removal rate.

8 Claims, 15 Drawing Sheets

(51) Int. Cl.
  *H01L 21/02* (2006.01)
  *H01L 21/66* (2006.01)

(56) References Cited

U.S. PATENT DOCUMENTS

| | | | | |
|---|---|---|---|---|
| 6,486,478 | B1* | 11/2002 | Libby | H01J 37/3053 |
| | | | | 204/192.1 |
| 7,247,845 | B1* | 7/2007 | Gebhardt | F03H 1/00 |
| | | | | 250/281 |
| 2002/0139772 | A1 | 10/2002 | Fenner | |
| 2003/0029479 | A1* | 2/2003 | Asano | B08B 1/04 |
| | | | | 134/18 |
| 2007/0010095 | A1* | 1/2007 | Takaoka | B08B 7/0035 |
| | | | | 438/689 |
| 2010/0132742 | A1* | 6/2010 | Tomita | B08B 3/08 |
| | | | | 134/18 |
| 2010/0229902 | A1* | 9/2010 | Kanzaki | G01N 21/94 |
| | | | | 134/56 R |
| 2012/0125889 | A1 | 5/2012 | Toyoda et al. | |
| 2014/0083976 | A1 | 3/2014 | Toyoda et al. | |
| 2015/0007858 | A1* | 1/2015 | Matsuo | H01L 21/02063 |
| | | | | 134/18 |

FOREIGN PATENT DOCUMENTS

| | | |
|---|---|---|
| JP | H11-330033 | 11/1999 |
| JP | 2003-505867 A | 2/2003 |
| JP | 2008-80230 A | 4/2008 |
| JP | 2011171487 A | 9/2011 |
| JP | 2011187614 A | 9/2011 |
| JP | 2011249544 A | 12/2011 |
| TW | 201201249 A1 | 1/2012 |
| WO | 01/06538 A1 | 1/2001 |

OTHER PUBLICATIONS

John F Mahoney, Method and Device for Cleaning Contaminated Surface Using Cluster Beam Having Energy, Abstract for JPH11-330033, Nov. 30, 1999, http://www.19.ipdl.inpit.gp.jp.
International Search Report, International Application No. PCT/JP2013/001046, dated May 14, 2013.
Watanabe Genta, Substrate Processing Apparatus and Substrate Processing Method, Abstract for JP2011187614A, Sep. 22, 2011, http://worldwide.espacenet.com.
Matsui Hideaki et al., Substrate Rear Surface Flattening Method, Abstract for JP2011171487A, Sep. 1, 2011, http://worldwide.espacenet.com.
Cluster Beam Generator, Substrate Processing Apparatus, Cluster Beam Generation method and Substrate Processing Method, Abstract for JP2011249544A; Dec. 8, 2011, http://worldwide.espacenet.com.
Takaaki Aoki et al., "Cluster size dependence of the impact process on a carbon substrate", Nuclear Instruments and Methods in Physics Research B 153, pp. 264-269, Jun. 30, 1999, 1999 Elsevier Science B. V.

* cited by examiner

NON-IRRADIATION PORTION

IRRADIATION PORTION

SUBSTRATE CLEANING METHOD, SUBSTRATE CLEANING DEVICE, AND VACUUM PROCESSING DEVICE

FIELD OF THE INVENTION

The present invention relates to a technique for removing particles on a substrate by using a gas cluster.

BACKGROUND OF THE INVENTION

In a semiconductor manufacturing apparatus, a product yield is greatly affected by adhesion of particles to a substrate during a manufacturing process. To this end, the substrate is cleaned before or after the processing. However, it is required to develop a cleaning technique for simply and reliably removing particles while reducing damage to the substrate. As for a cleaning technique that is being currently studied and developed, there is suggested a technique for peeling off particles from a surface of a substrate by applying physical shearing force greater than adhesive force between the particles and the substrate. A technique using physical shearing force of a gas cluster is an example thereof.

The gas cluster is an aggregate of atoms or molecules obtained by ejecting a high-pressure gas in vacuum and cooling the gas to a condensation temperature by adiabatic expansion. During the cleaning of the substrate, particles are removed by irradiating to the substrate gas cluster with proper acceleration or no acceleration. The gas clusters are obliquely irradiated to the substrate. Therefore, in the case of removing the particles adhered to the pattern on the surface of the substrate, the pattern acts as a structure in view of the particles. Accordingly, it is difficult for the gas cluster disturbed by the structure to reach the particles, and this makes the removal of the particles in the recess difficult.

Further, the present inventors have discovered that the particle removal rate may vary even in the case of using the same gas cluster nozzle and the difference in the removal rate is related to diameters of the particles. When the particle removal rate is low, an acceleration voltage of gas clusters may be increased to increase kinetic energy. In that case, however, the surface of the substrate may be damaged.

In Japanese Patent Application Publication No. H4-155825, there is illustrated a drawing showing that clusters of a rare gas are perpendicularly incident on an object surface. However, a difference in a removal rate in accordance with diameters of particles is not described.

In addition, Japanese Patent Application Publication No. H11-330033 discloses a desired size of clusters for the case of removing micron particles or sub-micron particles. However, the object of the present invention and the solution thereto are not disclosed therein.

SUMMARY OF THE INVENTION

In view of the above, the present invention provides a technique capable of removing particles adhered to a surface of a substrate at a high removal rate.

In accordance with the present invention, there is provided a substrate cleaning method, for removing particles adhered to a substrate, including; acquiring particle information including diameters of the particles adhered to the substrate; controlling, based on the acquired particle information, a factor related to sizes of gas clusters having aggregates of atoms or molecules of a cleaning gas; ejecting the cleaning gas, at a higher pressure than a processing atmosphere where the substrate is provided, to the processing atmosphere and generating the gas clusters by adiabatic expansion; and removing the particles by irradiating the gas clusters in a perpendicular direction to a surface of the substrate.

In accordance with the present invention, there is provided a substrate cleaning device, for removing particles adhered to a substrate, including: a cleaning chamber where the substrate is provided and cleaned in a vacuum atmosphere; a nozzle unit configured to eject a cleaning gas, at a higher pressure than a processing atmosphere in the cleaning chamber, toward the substrate in the cleaning chamber and generating gas clusters having aggregates of atoms or molecules of the cleaning gas by adiabatic expansion; and a control unit configured to output a control signal for controlling a factor related to sizes of the gas clusters based on particle information including diameters of the particles adhered to the substrate, wherein the nozzle unit is set to irradiate the gas clusters in perpendicular direction to the surface of the substrate.

In accordance with the present invention, there is provided a vacuum processing apparatus, for performing vacuum processing on a substrate by using a vacuum processing module, including: the substrate cleaning device of the present invention; and a substrate transfer unit for transferring the substrate between the substrate cleaning device and the vacuum processing module.

Effect of the Invention

In the present invention, the particle information including the diameters of the particles adhered to the substrate is acquired, and the gas clusters are perpendicularly irradiated to the surface of the substrate by adjusting a factor related to the size of the gas clusters based on the acquired information. Therefore, the cleaning process can be performed by the gas clusters having the size corresponding to the diameters of the particles. As a result, even if a pattern recess is formed in the surface of the substrate, the particles in the recess can be removed at a high removal rate.

DETAILED DESCRIPTION OF THE EMBODIMENTS

Figure 1:
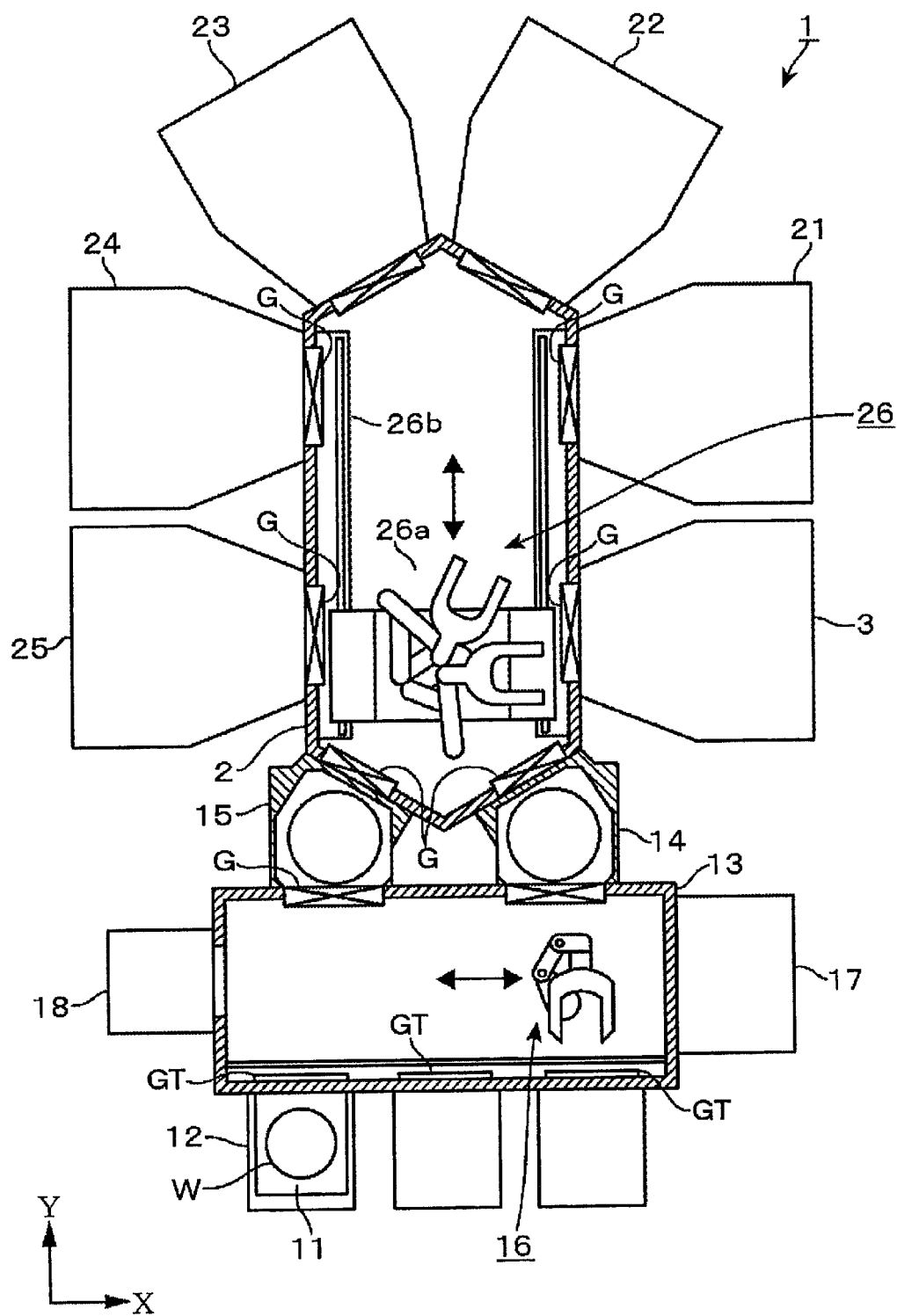
FIG. 1 is a top view showing a vacuum processing apparatus in accordance with an embodiment of the present invention.

A vacuum processing apparatus including a substrate cleaning device in accordance with a first embodiment of the present invention will be described with reference to the drawings. FIG. 1 is a top view showing an overall configuration of a vacuum processing apparatus 1 that is a multi-chamber system. In the vacuum processing apparatus 1, a loading/unloading port 12 for mounting thereon a FOUP 11 that is an airtight transfer container accommodating therein 25 substrates, e.g., semiconductor wafers (hereinafter, referred to as "wafer") is provided at, e.g., three locations, in a horizontal direction. An atmospheric transfer chamber 13 is provided along the arrangement of the loading/unloading ports 12. A gate door GT that is opened/closed together with a cover of the FOUP 11 is provided at a front wall of the atmospheric transfer chamber 13.

Two load-lock chambers 14 and 15 are airtightly connected to a side of the atmospheric transfer chamber 13 which is opposite to the loading/unloading ports 12. Each of the load-lock chambers 14 and 15 includes a vacuum pump and a leakage valve (both not shown), so that an inner atmosphere thereof can be switched between an atmospheric atmosphere and a vacuum atmosphere. A notation G in FIG. 1 denotes a gate valve (sluice valve). In the atmospheric transfer chamber 13, a first substrate transfer unit 16 having a joint arm is provided to transfer a wafer W. When seen from a front side toward a rear side of the atmospheric transfer chamber 13, a wafer inspection unit 17 that is a substrate inspection unit is provided at a right wall of the atmospheric transfer chamber 13, and an alignment chamber 18 for adjusting eccentricity or an orientation of a wafer W is provided at a left wall of the atmospheric transfer chamber 13. The first substrate transfer unit 16 transfers the wafer W with respect to the FOUP 11, the load-lock chambers 14 and 15, the wafer inspection unit 17 and the alignment chamber 18. Accordingly, the first substrate transfer unit 16 is movable vertically and along the arrangement direction of the FOUP 11 (X direction in FIG. 1). Further, the first substrate transfer unit 16 is movable back and forth and rotatable about a vertical axis.

When seen from the atmospheric transfer chamber 13, a vacuum transfer chamber 2 is airtightly connected to rear sides of the load-lock chambers 14 and 15. The vacuum transfer chamber 2 is airtightly connected to a cleaning module 3 that is a substrate cleaning device and a plurality of, e.g., five in this example, vacuum processing modules 21 to 25. In this example, the vacuum processing modules 21 to 25 are configured to perform sputtering or CVD (Chemical Vapor Deposition) for film formation including Cu wiring on a wafer W having recesses for forming a circuit pattern, e.g., via holes or grooves for filling Cu wiring.

The vacuum transfer chamber 2 includes a second substrate transfer unit 26 for transferring a wafer W in a vacuum atmosphere. The substrate transfer unit 26 transfers the wafer W between the load-lock chambers 14 and 15, the cleaning module 3, and the vacuum processing modules 21 to 25. The second substrate transfer unit 26 has a multi-joint arm 26a capable of moving back and forth and rotating about a vertical axis. The arm 26a can be moved in a lengthwise direction (Y direction in FIG. 1) through a base 26b.

Next, the wafer inspection unit 17 and the cleaning module 3 will be described. The wafer inspection unit 17 acquires particle information including diameters of particles adhered to the wafer W. The particle information shows, e.g., positions and sizes of the particles on the wafer W. As for the wafer inspection unit 17, there may be used an apparatus capable of evaluating diameters of particles on a wafer surface, e.g., an optical type or electron beam type surface defect inspection device using regular reflection light or scattering light. It is also possible to use a scanning probe microscope such as a scanning electron microscope (SEM) or a scanning tunneling microscope (STM), an atomic force microscope (AFM) or the like.

Specifically, the wafer inspection unit 17 includes a Puma 9500 series dark-field pattern wafer inspection device manufactured by KLA Tencor Corporation, a 2830 series bright-field pattern wafer inspection device manufactured by KLA Tencor Corporation, a CG4000 series high resolution FEB measuring device manufactured by Hitachi High-Technologies Corporation, an RS6000 series defect review SEM device manufactured by Hitachi High-Technologies Corporation, and the like. The wafer that is a processing target of the present invention may have no pattern recess. In that case, as for the wafer inspection unit, there may be used, e.g., a SP3 dark-field non-pattern defect inspection device manufactured by KLA Tencor Corporation.

Figure 2:
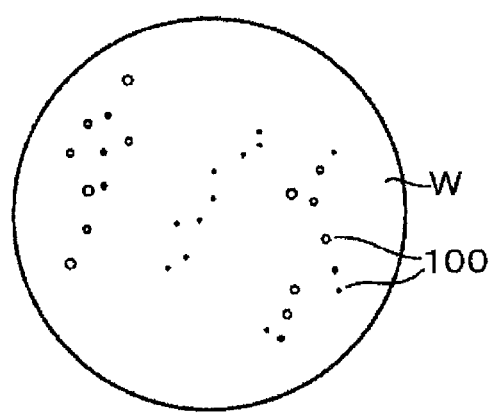
FIG. 2 is a top view showing a surface of a wafer.

In the case of using such an inspection device, a loading/unloading port for transfer of a wafer W is provided, e.g., within an access range of the first substrate transfer unit 16, and the wafer W may be transferred between an inspection region in the wafer inspection unit 17 and the first substrate transfer unit 16 through the loading/unloading port. The loading/unloading port of the inspection device may be omitted and the inspection device main body may be connected to the atmospheric transfer chamber 13. The wafer inspection unit 17 detects a surface state of the wafer W, as shown in FIG. 2, for example. Accordingly, the particle information in which the positions and the sizes of the particles are associated each other is acquired. In FIG. 2, a reference numeral 100 denotes particles. The acquired particle information is transmitted to a control unit 7 to be described later.

Figure 3:
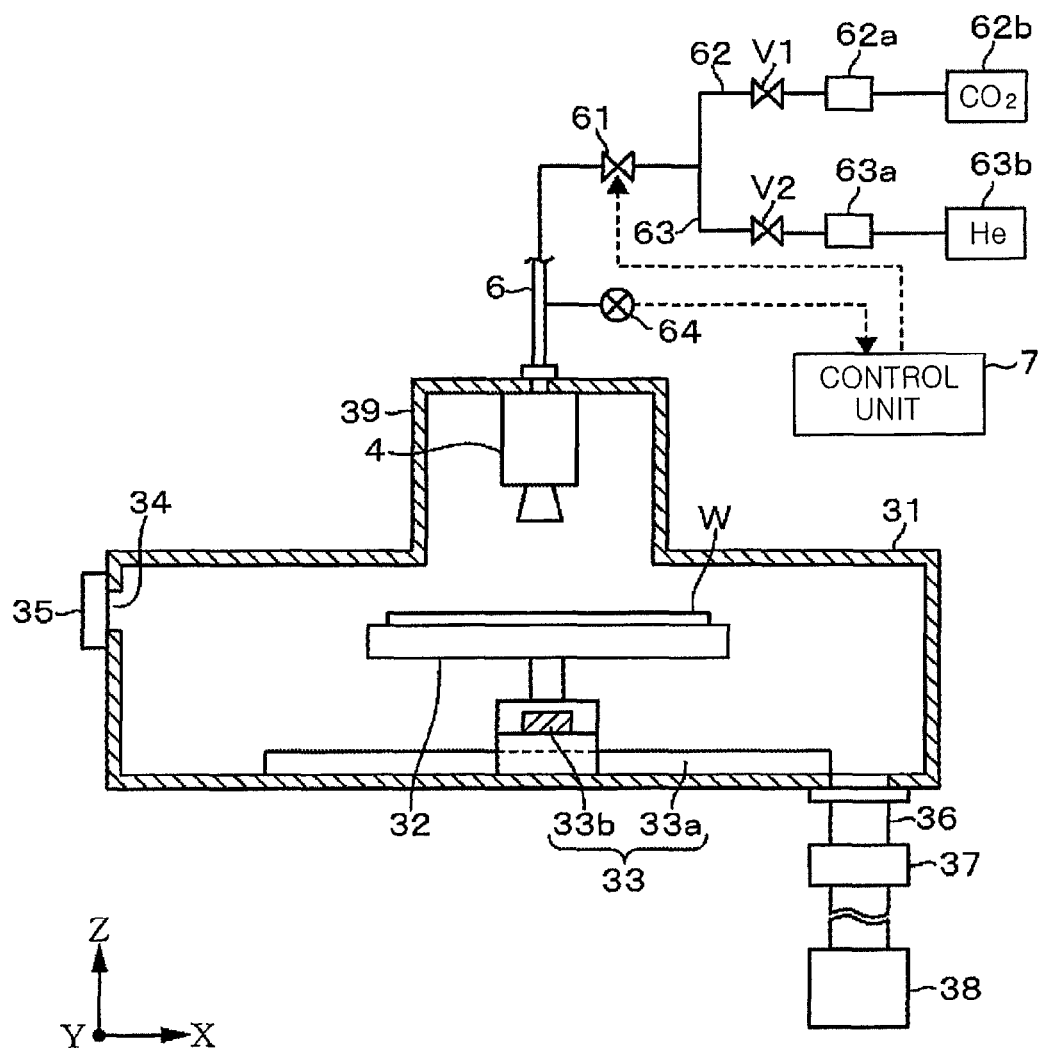
FIG. 3 is a vertical cross sectional view showing an example of a substrate cleaning device provided at the vacuum processing apparatus.

Next, the cleaning module 3 will be described with reference to FIG. 3. The cleaning module 3 includes a cleaning chamber 31 that is a vacuum container where wafers W are accommodated and subjected to a deposit removal process. In the cleaning chamber 31, a mounting table 32 for mounting thereon a wafer W is provided. At a central portion of a ceiling surface of the cleaning chamber 31, an upwardly protruding portion 39 (e.g., of a cylindrical shape) is formed upward, and a nozzle unit 4 is provided as a gas cluster generation mechanism in the protruding portion 39. In FIG. 3, a reference numeral 34 denotes a transfer port and a reference numeral 35 denotes a gate valve for opening/closing the transfer port 34.

Although it is not illustrated, support pins (not shown) penetrating through holes formed in the mounting table 32 are provided, e.g., on a bottom surface of the cleaning chamber 31 at positions close to the transfer port 35. An elevation mechanism (not shown) for vertically moving the support pins is provided below the mounting table 32. The support pins and the elevation mechanism allow the wafer W to be transferred between the second substrate transfer unit 26 and the mounting table 32. One end of a gas exhaust line 36 for vacuum-evacuating an atmosphere in the cleaning chamber 31 is connected to the bottom surface of the cleaning chamber 31. The other end of the gas exhaust line 36 is connected to a vacuum pump 38 via a pressure control unit 37 such as a butterfly valve or the like.

The mounting table 32 is horizontally movable by a driving unit 33 so that the wafer W on the mounting table 32 is relatively scanned by the nozzle unit 4. The driving unit 33 includes an X-axis rail 33a extending horizontally along an X-axis direction on the bottom surface of the cleaning chamber 31 which is located below the mounting table 32, and a Y-axis rail 33b extending horizontally along a Y-axis direction. The Y-axis rail 33b is movable along the X-axis rail 33a, and the mounting table 32 is supported above the Y-axis rail 33b. Further, the mounting table 32 includes a temperature control mechanism (not shown) for controlling a temperature of the wafer W on the mounting table 32.

Figure 4:
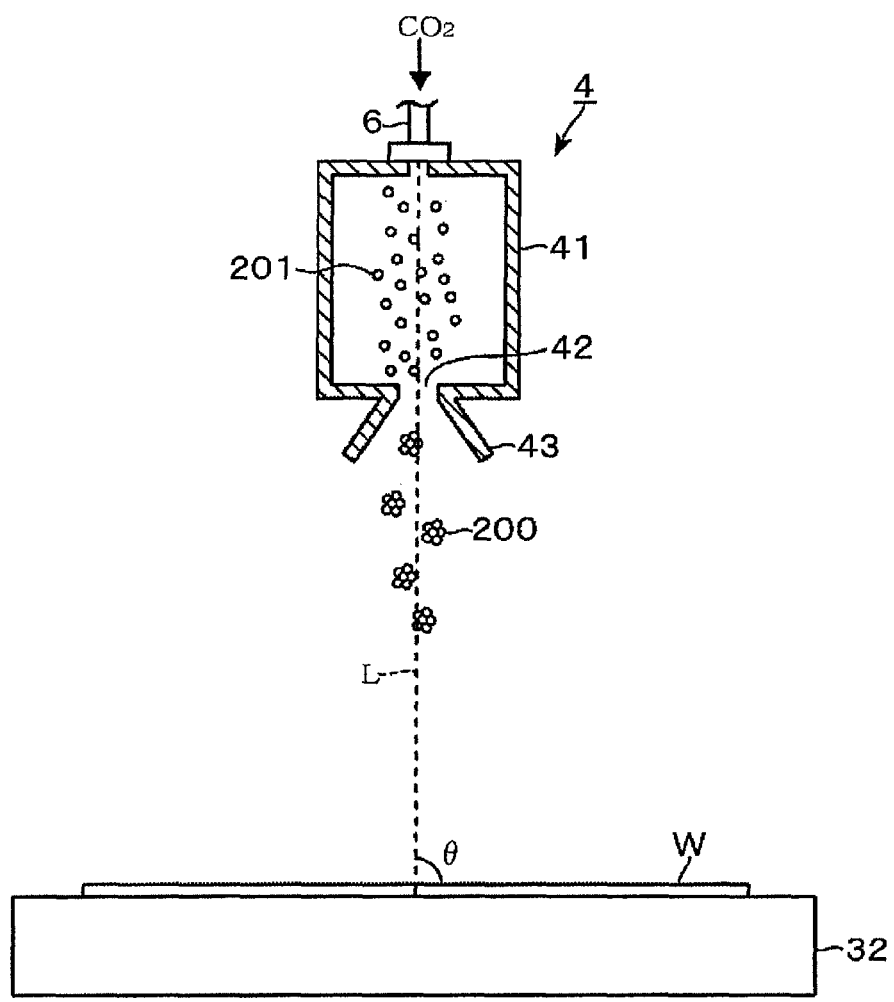
FIG. 4 is a vertical cross sectional view showing an example of a nozzle unit of the substrate cleaning device.

The nozzle unit 4 ejects a cleaning gas at a higher pressure than a processing atmosphere of the cleaning chamber 31 toward the wafer W in the cleaning chamber 31, and gas clusters as aggregates of atoms or molecules of the cleaning gas are generated by adiabatic expansion. As shown in FIG. 4, the nozzle unit 4 has a substantially cylindrical pressure chamber 41 having an opening at a lower end thereof. The lower end portion of the pressure chamber 41 is formed as an orifice 42. The gas diffusion portion 43 that is widened downward is connected to the orifice 62. The opening diameter of the orifice 42 is, e.g., about 0.1 mm.

As described above, the nozzle unit 4 irradiates the gas clusters to the surface of the wafer W in a perpendicular direction to the surface of the wafer W. Here, "irradiation in a perpendicular direction" indicates a state, as shown in FIG. 4, in which an angle θ between a central axis L in the lengthwise direction of the nozzle unit 4 and the mounting surface of the mounting table 32 (the surface of the wafer W) is within a range of 90°±15°. When the gas clusters from the nozzle unit 4 are ionized while moving and the moving path thereof is bent by a bending mechanism, "perpendicularly irradiates" means a state in which the angle between the designed path and the surface of the wafer W is within the above range. The angle θ between the central axis L and the surface of the wafer W corresponds to an irradiation angle of the gas cluster in test examples to be described later.

In the example shown in FIG. 3, the mounting table 32 is moved to change the irradiation position of the gas clusters onto the wafer W. However, in the present invention, the nozzle unit 4 may be moved without moving the mounting table 32. In that case, a moving mechanism capable of moving the nozzle unit 4 in the X and the Y direction may be provided at a ceiling portion of the cleaning chamber 31, and a flexible gas supply line may be connected to a gas inlet port of the nozzle unit 4.

One end of a gas supply line 6 extending through the ceiling surface of the cleaning chamber 31 is connected to the upper end of the pressure chamber 41. The gas supply line 6 is connected to a $CO_2$ gas supply line 62 and a He gas supply line 63 via a pressure control valve 61 constituting a pressure control unit. The $CO_2$ gas supply line 62 is connected to a $CO_2$ gas supply source 62b via an opening/closing valve V1 and a $CO_2$ gas flow rate control unit 62a. The He gas supply line 63 is connected to a He gas supply source 63b via an opening/closing valve V2 and a He gas flow rate control unit 63a.

The $CO_2$ gas is a cleaning gas and generates gas clusters. He gas is an extrusion gas and hardly generates clusters. If $CO_2$ gas is mixed with He gas, the speed of the clusters generated by $CO_2$ gas is increased. Further, a pressure detection unit 64 for detecting a pressure in the gas supply line 6 is provided at the gas supply line 6. The control unit 7 to be later described controls an opening degree of the pressure control valve 61 based on the detection value of the pressure detection unit 64, so that the gas pressure in the pressure chamber 41 is controlled. The pressure detection unit 64 may detect a pressure in the pressure chamber 41.

The pressure control based on the detection value of the pressure detection unit 64 may be carried out by gas flow rate control of the $CO_2$ gas flow rate control unit 62a and the He gas flow rate control unit 63a. Further, a gas supply pressure may be increased by using, e.g., a boosting unit such as a gas booster, between the pressure control valve 61 and each of the opening/closing valves V1 and V2, and may be controlled by the pressure control valve 61.

Figure 5:
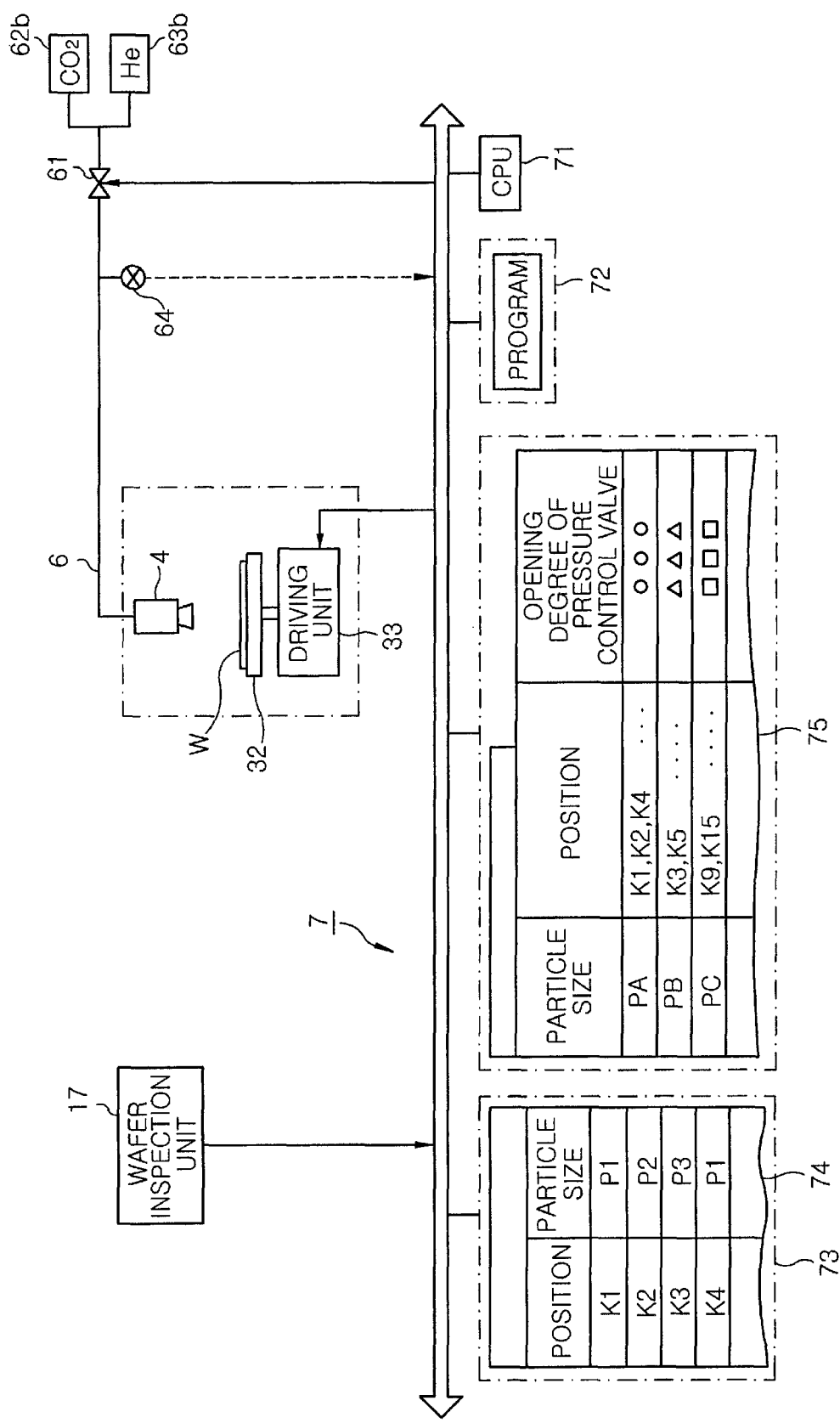
FIG. 5 is a configuration view showing an example of a control unit provided at the vacuum processing apparatus.

As shown in FIG. 5, the vacuum processing apparatus 1 includes the control unit 7 including, e.g., a computer, for controlling an overall operation of the apparatus. The control unit 7 includes a CPU 71, a program 72, and a storage unit 73. The program 72 has steps for executing an operation of the apparatus which correspond to vacuum processing of the vacuum processing modules 21 to 25 in addition to a cleaning process to be described later. The program 72 is stored in a storage medium, e.g., a hard disk, a compact disk, a magneto-optical disk, a memory card, a flexible disk or the like, and installed in the control unit 7.

The particle information 74 acquired from the wafer inspection unit 17 is stored in the storage unit 73. The particle information 74 is information in which positions on the wafer W are associated with sizes of particles. The sizes of the particles are defined as diameter ranges of the particles, e.g., a range greater than or equal to 20 nm and smaller than 40 nm, a range greater than or equal to 40 nm and smaller than 60 nm and the like, which are set by the wafer inspection unit 17. In FIG. 5, the sizes are expressed as P1, P2 . . . and treated as normalized values. Further, the positions on the wafer W indicate coordinates on the wafer which are managed by the wafer inspection unit 17. In FIG. 5, the positions on the wafer W are expressed as K1, K2, K3 . . . . The coordinates on the wafer may be determined as positions on an XY coordinate system having an X-axis that is a line passing through the center of the wafer W and a center of a notch formed at the wafer W to indicate a crystal direction and a Y-axis that is a line perpendicular thereto.

Based on the particle information 74, the control unit 7 has a function of creating a data table 75 showing associations between particle diameter ranges of the particles and positions of the particles in such diameter ranges. The diameter ranges of the particles are assigned on the basis of preset sizes (diameters) of the gas clusters. In FIG. 5, the diameter ranges of the particles in the data table 75 are expressed as PA, PB, . . . and treated as normalized values.

As will be described later, the normalized particle diameters are associated with the gas cluster sizes suitable for removal of the particles. Further, the gas cluster sizes are correlated to gas supply pressures as a factor for determining the gas cluster sizes. Therefore, the data table 75 of the storage unit 73 includes data on relationship between the gas cluster irradiation positions on the surface of the wafer W and the gas pressures. The program 72 reads out the data and outputs to the driving unit 33 of the cleaning module 3 a control signal for sequentially moving the wafer W to the gas cluster irradiation positions. Further, the program 72 outputs an instruction signal (control signal) for controlling an opening degree of the pressure control valve 61 to determine the gas pressure during the irradiation of the gas cluster.

Figure 6:
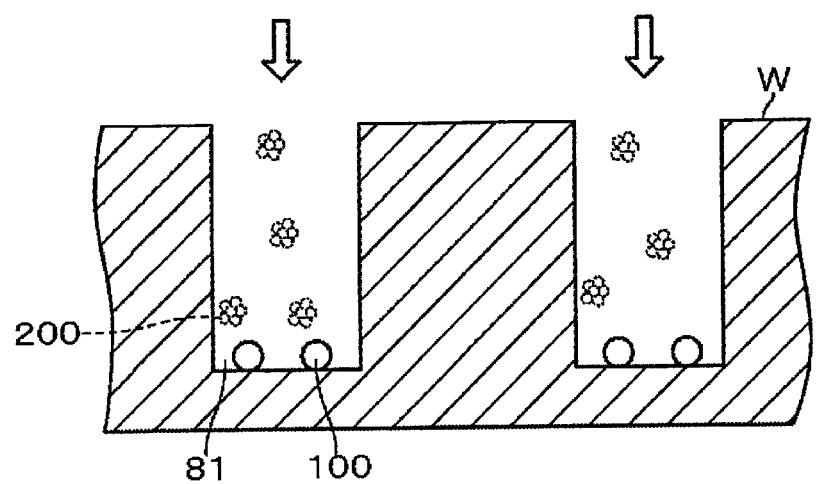
FIG. 6 is a vertical cross sectional view showing recesses formed in a substrate.

Hereinafter, an operation of the above embodiment will be described. When the FOUP 11 is mounted on the loading/unloading port 12, a wafer W is taken out from the FOUP 11 by the first substrate transfer unit 16. As shown in FIG. 6, the wafer W has pattern recesses (grooves and via holes) 81 for filling Cu wiring. Next, the wafer W is transferred to the alignment chamber 18 via the atmospheric transfer chamber 13 in an atmospheric atmosphere and aligned therein. Then, the wafer W is transferred to the wafer inspection unit 17 by the first substrate transfer unit 16, and the particle information is acquired in the wafer inspection unit 17. The acquired particle information is transmitted to the control unit 7, and the control unit 7 creates the aforementioned data table 75.

The wafer W inspected by the wafer inspection unit 17 is loaded into the load-lock chamber 14 or 15 set to an atmospheric atmosphere by the first substrate transfer unit 16. Then, the atmosphere in the load-lock chamber 14 or 15 is switched to a vacuum atmosphere. Next, the wafer W is transferred to the cleaning module 3 by the second substrate transfer unit 26 and subjected to a particle removal process. In this example, when the wafer W inspected by the wafer inspection unit 17 is transferred to the cleaning module 3, the wafer W is transferred from the wafer inspection unit 17 to the first substrate transfer unit 16. Thus, the first substrate transfer unit 16 corresponds to a substrate transfer unit for transmitting the wafer W inspected by the wafer inspection unit 17 to the cleaning module 3.

In the cleaning module 3, a process of removing particles from the surface of the wafer W by using gas clusters is carried out. The gas clusters are aggregates of atoms or molecules of a gas and generated by supplying a gas at a higher pressure than a processing atmosphere where the wafer W is disposed to the processing atmosphere and cooling the gas to a condensation temperature by adiabatic expansion. A processing pressure in the cleaning chamber 31 of the processing atmosphere is set to a vacuum atmosphere of, e.g., 0.1 Pa to 100 Pa, and a cleaning gas ($CO_2$ gas) is supplied to the nozzle unit 4 at a pressure of, e.g., 0.3 MPa to 5.0 MPa. When the cleaning gas is supplied to the processing atmosphere of the cleaning chamber 31, the cleaning gas is cooled to a level lower than the condensation temperature by abrupt adiabatic expansion. As a consequence, as shown in FIG. 4, molecules 201 are bonded together by Van der Waals force, thereby forming gas clusters 200 as aggregates of the molecules 201. In this example, the gas clusters 200 are neutral. For example, a single gas cluster including $5 \times 10^3$ atoms (molecules) has a size of about 8 nm. Therefore, it is preferable to obtain a gas cluster of $5 \times 10^3$ atoms (molecules) or above.

The gas clusters 200 generated from the nozzle unit 4 are irradiated toward the wafer W in a perpendicular direction to the surface of the wafer W. As shown in FIG. 6, the gas clusters 200 enter the recesses 81 for a circuit pattern of the wafer W and blow away the particles 100 in the recesses 81. As a consequence, the particles 100 are removed.

Figure 7A:
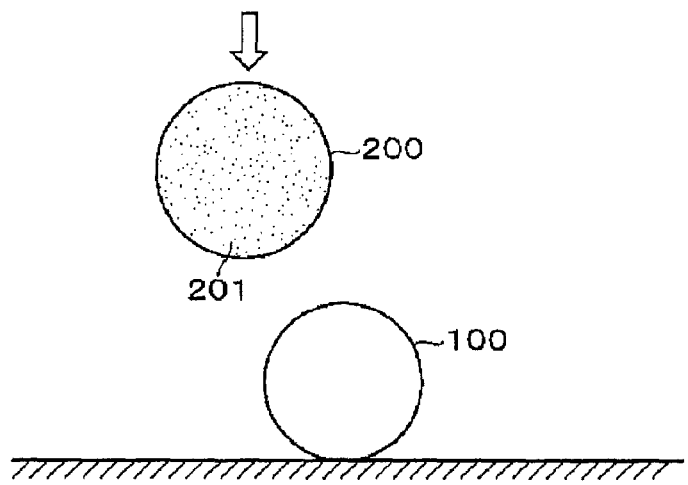
FIGS. 7A to 7D are side views showing a state in which particles are being removed by a gas cluster.
Figure 7B:
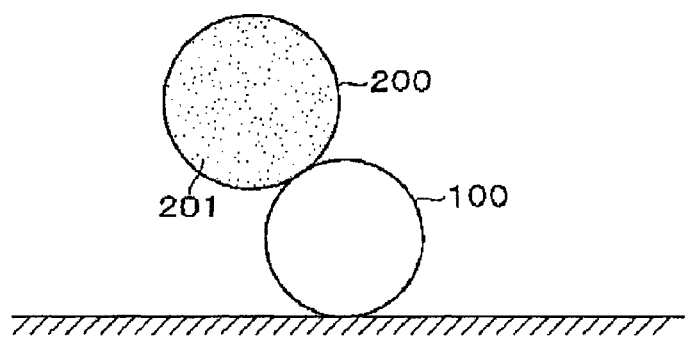
Figure 7C:
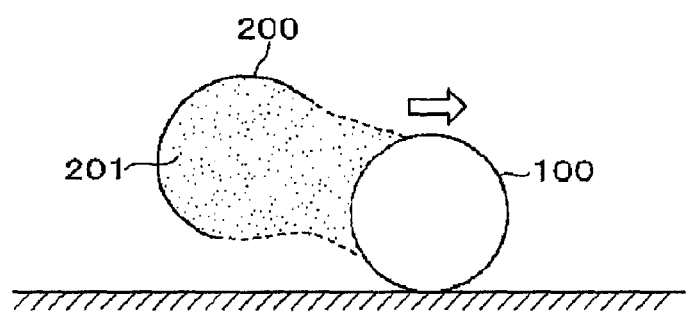
Figure 7D:
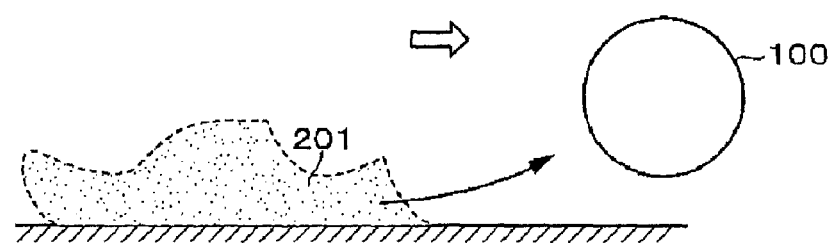

FIGS. 7A to 7D and FIGS. 8A to 8D schematically show the state in which the particle 100 on the wafer W is being removed by the gas cluster 200. FIG. 7 shows the case in which the gas cluster 200 collides with the particle 100 on the wafer W. In that case, as shown in FIG. 7A, the gas cluster 200 is irradiated to the surface of the wafer W in a perpendicular direction to the surface of the wafer W and is highly likely to collide with the particle 100 from an oblique upper side. If, as shown in FIG. 7B, the gas cluster 200 collides with the particle 100 in an offset state (the state in which the center of the gas cluster 200 and the center of the particle 100 are not aligned when seen from the top), as shown in FIG. 7C, a horizontal moving force is applied to the particle 100 by the shock from the collision. As a result, the particle 100 is peeled off from the surface of the wafer W and blown away in a lateral direction or in an obliquely upward direction.

Figure 8A:
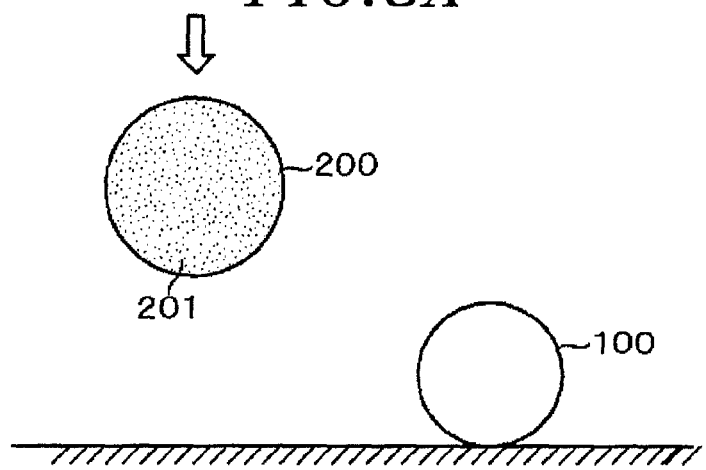
FIGS. 8A to 8D are side views showing a state in which particles are being removed by a gas cluster.
Figure 8B:
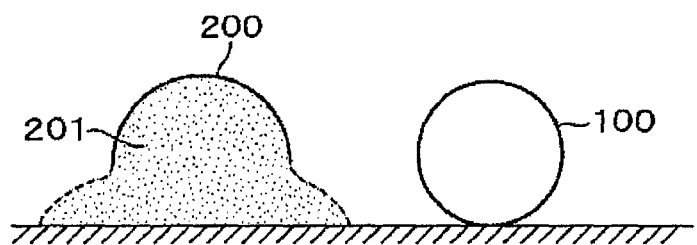
Figure 8C:
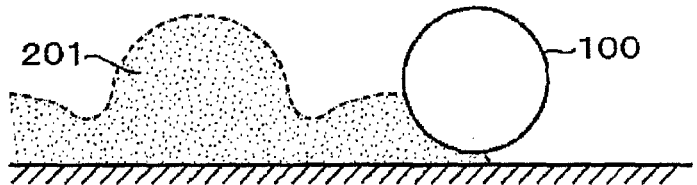
Figure 8D:
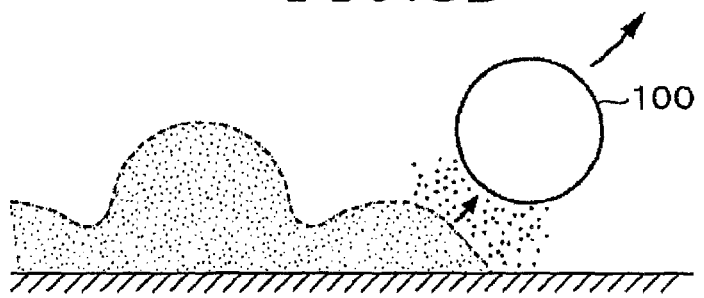

As shown in FIG. 8A, the particle 100 can also be removed by irradiating the gas cluster 200 not directly to the particles 100 but to the vicinity of the particles 100. When the gas cluster 200 collides with the wafer W, the molecules 201 of the gas cluster 200 are decomposed and diffused in a horizontal direction (see FIG. 8B). At this time, a region of a high kinetic energy density is shifted in a horizontal direction, so that the particle 100 is peeled off from the wafer W and blown away (see FIGS. 8C and 8D). In this manner, the particles 100 are sputtered from the recesses 81 to scatter in the cleaning chamber 31 of the vacuum atmosphere and to be discharged to the outside of the cleaning chamber 31 through the gas exhaust line 36.

Hereinafter, the size of the gas cluster and the particle cleaning performance will be described. As clearly can be seen from the test examples to be described later, the size of the gas cluster 200 which is suitable for the cleaning varies depending on diameters of the particles 100. If the gas clusters 200 are excessively larger than the particles 100, a sufficient removal performance is not obtained and the pattern is excessively damaged. On the contrary, if the gas clusters 200 are excessively smaller than the particles 100, physical peeling force sufficient for removal is not applied, so that sufficient removal performance is not obtained. Therefore, it is preferable to set the size of the gas cluster to be about 0.2 to 2 times greater than the diameter of the particle. As clearly can be seen from the following test examples, the size of the gas cluster depends on the supply pressure of $CO_2$ gas as a cleaning gas. Hence, as described above, the control unit 7 sets the supply pressure of $CO_2$ gas based on the particle information acquired from the wafer inspection unit 17 in order to obtain a desired size of the gas cluster 200. The supply pressure of the $CO_2$ gas is controlled by, e.g., an opening degree of the pressure control valve 61.

In this manner, in the cleaning module 3, the particles 100 are removed by locally irradiating the gas clusters 200 from the nozzle unit 4 in a state where the pressure control valve 61 is controlled in accordance with the sizes of the particles on the wafer W.

As described above with reference to FIG. 5, the particle information includes information on the adhesion positions of the particles on the wafer W (K1, K2 and the like shown in FIG. 5). The control unit 7 stores data on associations between particle sizes and particle positions. If the particle sizes are the same, the irradiation condition becomes the same. Therefore, the gas clusters are irradiated to the particle positions corresponding to the particle sizes under he same irradiation conditions. Specifically, if the particle size is PA, the gas clusters are irradiated to the positions K1, K2, K4, . . . under the irradiation conditions suitable for the removal of the particles having the particle size PA. Then, the gas cluster irradiation conditions are changed, and the gas cluster is irradiated to the positions K3, K5, . . . of the particle size PB under the irradiation conditions suitable for removal of the particles having the particle size PB. In this manner, the cleaning process is carried out.

The wafer W from which the particles 100 have been removed in the cleaning module 3 is transferred to the vacuum processing module for performing, e.g., sputtering via the vacuum transfer chamber 2 by the second substrate transfer unit 26. Then, a barrier layer made of, e.g., titanium (Ti) or tungsten (W), is formed in the recesses 81. Next, the wafer W is transferred to the vacuum processing module for performing CVD, and Cu is filled in the recesses 81 to form Cu wiring, for example. Thereafter, the wafer W is loaded into the load-lock chamber 14 or 15 set to the vacuum atmosphere by the second substrate transfer unit 26. Then, the atmosphere in the load-lock chamber 14 or 15 is switched to the atmospheric atmosphere. Next, the wafer W is transferred to the atmospheric transfer chamber 13 and returned to the original FOUP 11 on the loading/unloading port 12 by the first substrate transfer unit 16.

In accordance with the above embodiment, the particle information including the diameters of the particles 100 and the adhesion positions of the particles 100 is acquired by inspecting the surface of the wafer W. Since the gas clusters 200 having sizes that have been adjusted to correspond to the sizes of the particles 100 based on the particle information are irradiated to the surface of the wafer W, the performance of removing the particles 100 adhered to the wafer W can be improved. Further, the gas clusters 200 are irradiated to the wafer W in a perpendicular direction to the surface of the wafer W, so that the gas clusters 200 can be reliably irradiated into the recesses 81 without being disturbed by wall portions defining the recesses 81. Accordingly, the gas clusters 200 reach the particles 100 in the recesses 81, and the particles 100 can be removed at a high removal rate.

Since the particles can also be removed by irradiating the gas clusters 200 to the vicinity of the particles 100, the irradiation amount (dose amount) of the gas clusters 200 can be decreased. This is because when the gas clusters 200 are irradiated to a certain point, a plurality of particles 100 near the irradiation point can be removed. Hence, the number of irradiated gas clusters 200 can be decreased.

This suppresses pressure increase of the processing atmosphere due to irradiation of the gas clusters, so that the pressure in the cleaning chamber 31 can be maintained at a low level. The speed of the gas clusters 200 is high under such a low pressure, so that the gas clusters 200 collide with the wafer W or the particles 100 at a high speed and the impact force at the time of the collision becomes large. Therefore, the breaking force at the time of decomposition of the gas cluster 200 into the molecules 201 becomes large, and the energy applied to the collided particles 100 and the particles 100 adjacent thereto is increased. By reducing the irradiation amount of the gas clusters 200, the speed of the gas clusters 200 can be increased, which contributes the particle removal. From this, it is clear that the control of the irradiation amount of the gas clusters 200 is effective for the particle removal.

Meanwhile, the removal rate varies depending on the sizes of the particles 100. In the case of performing the cleaning using a conventional two-fluid spray method, when the size of the particle 100 is smaller than 200 nm, the removal rate is decreased. In the two-fluid spray method, particles are removed by injecting a mixture of $N_2$ gas and waterdrops of several tens of μm to the wafer in a spray shape.

As clearly can be seen from the test examples to be described later, the particle removal by the irradiation of the gas clusters 200 is effective even for the particles 100 having a size of 12 nm to 49 nm. According to the test examples, the irradiation amount of the gas clusters is preferably in order of $10^{11}$ to $10^{15}/cm^2$. Here, the irradiation amount of the gas clusters indicates the number of gas clusters irradiated per unit area. The irradiation amount of the gas clusters is measured by the following measuring method.

First, the generated gas clusters are ionized and collide with a Faraday cup arranged against the moving direction of the gas cluster. At this time, the number of the gas clusters is calculated by measuring a current value of the Faraday cup.

Next, there will be described the case of removing particles adhered to the wafer W before and after the vacuum processing in the cleaning module 3. In this example, the vacuum processing module performs etching or ashing. The wafer W accommodated in the FOUP 11 has on a surface thereof, e.g., a patterned photoresist mask. After the particle information is acquired by the wafer inspection unit 17, the wafer W is aligned and transferred to the cleaning module 3 via the load-lock chamber 14 or 15 and the vacuum transfer chamber 2. Then, the particles are removed as described above. Next, the wafer W is sequentially transferred to the vacuum processing module for performing etching and to the vacuum processing module for performing ashing. In this manner, as shown in FIG. 6, the pattern having the recesses 81 is formed. The reason of removing the particles on the wafer W before the etching is because the particles are considered as a part of the photoresist mask and cause etching defects.

If necessary, after the etching or the ashing, the particles may be removed again by the cleaning module 3. In that case, the wafer W that has been etched or ashed is transferred to the first substrate transfer unit 16 via the vacuum transfer chamber 2 and the load-lock chamber 14 or 15 and then to the wafer inspection unit 17, and the particle information is obtained. Then, the wafer W is transferred to the second substrate transfer unit 26 via the atmospheric transfer chamber 13 and the load-lock chamber 14 or 15 and then to the cleaning module 3, and the particles adhered due to the etching are removed. The cleaned wafer W is transferred to the first substrate transfer unit 16 via the vacuum transfer chamber 2 and the load-lock chamber 14 or 15 and returned to the original FOUP 11.

The wafer inspection unit 17 may be connected to the vacuum transfer chamber 2 at a location different from the cleaning module 3. As for the wafer inspection unit 17, a vacuum gauge device such as SEM (scanning electron microscope) or the like may be used. In this case, the substrate transfer unit for transferring the wafer inspected by the wafer inspection unit to the cleaning module 3 is also used as the substrate transfer unit for transferring the substrate between the washing module 3 and the vacuum processing module. The wafer inspection unit 17 may be used as a standalone device without being built in the vacuum processing apparatus. In that case, the acquired measurement information is transmitted to the control unit 4.

In the present invention, the particle information may be acquired by inspecting particles on a front wafer W in a lot and all the wafers W in the lot may be subjected to the particle removing treatment in the cleaning module 3 by using the same gas cluster irradiation condition set based on the acquired particle information. Otherwise, the particle information may be acquired by inspecting particles on all the wafers W in a lot and each of the wafers in the lot may be subjected to the particle removing treatment by using gas cluster irradiation conditions set based on the corresponding particle information.

Figure 9:
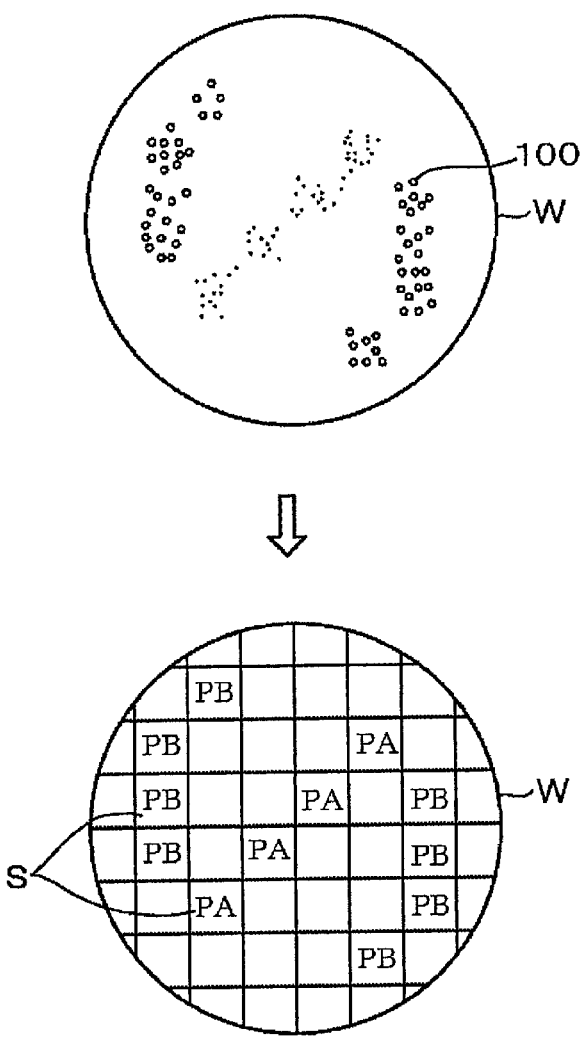
FIG. 9 is a top view showing a surface of a wafer.

In the above embodiment, the gas clusters are locally irradiated to the particle adhesion region on the surface of the wafer W, but, the present invention is not limited thereto. If the amount of the particles is large, the particle adhesion region may be normalized as, e.g., divided rectangular regions S of a predetermined size, on the basis of the particle sizes (normalized values by the range of the particle sizes). As shown in FIG. 9, for example, when the surface of the wafer W is divided in a checkerboard pattern and particles are included in a divided area S, there may be employed a method for selecting a gas cluster size in accordance with a particle size in the divided area S and irradiating gas clusters to the divided area S.

The gas clusters may be irradiated to the entire surface of the wafer W. In this case, the diameters of the particles on the wafer W are detected and the gas cluster size is controlled to correspond to the particle diameters. Depending on diameters of the particles, the gas clusters are controlled to have a plurality of sizes, and the entire surface is irradiated with the gas clusters of each size, for example.

Figure 10:
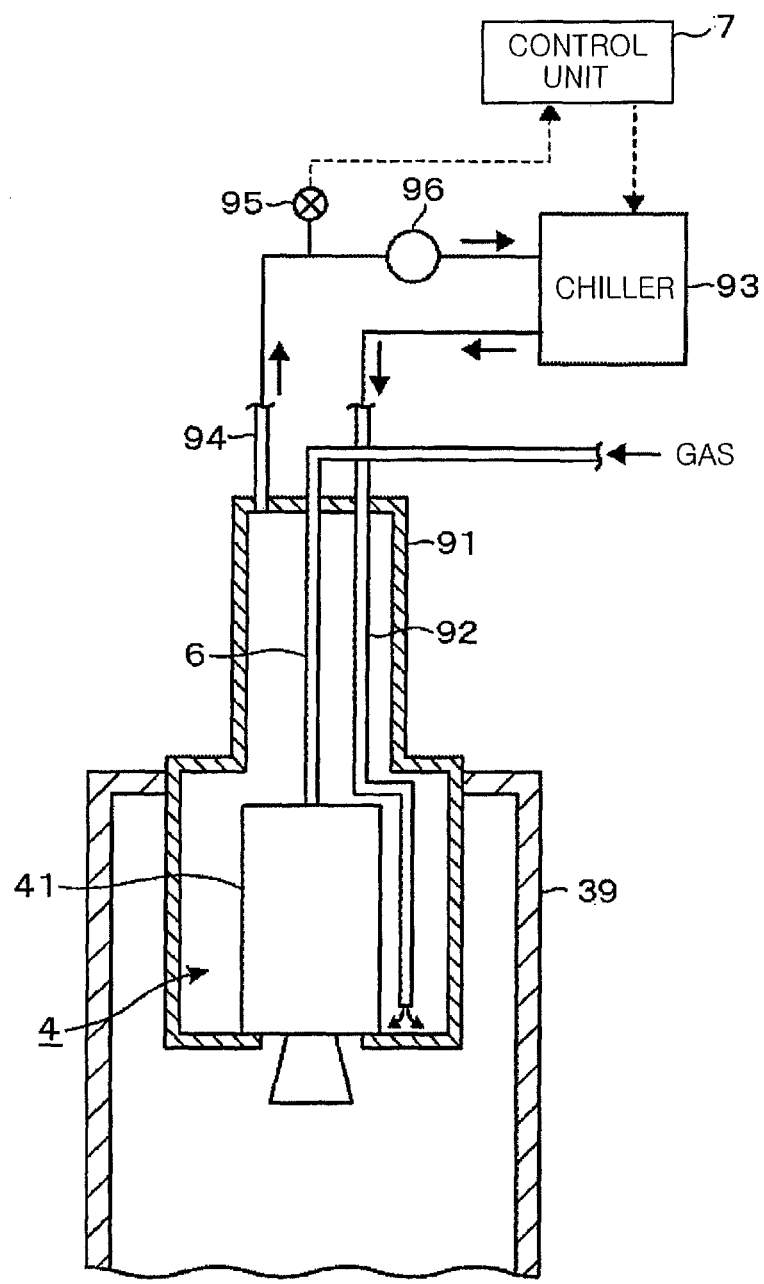
FIG. 10 is a vertical side view of a substrate cleaning device in accordance with a second embodiment of the present invention.

Hereinafter, a second embodiment of the present invention will be described with reference to FIG. 10. In this embodiment, a temperature of $CO_2$ gas is controlled as a factor of controlling a gas cluster size. In this example, a temperature control chamber 91 is provided, e.g., so as to surround the nozzle unit 4 and the periphery of the gas supply line 6 near the nozzle unit 4. In the temperature control chamber 91, a temperature control medium supply line 92 runs along the sidewall of the pressure chamber 41 and opens near the bottom of the pressure chamber 41. A chiller 93 is connected to the temperature control medium supply line 92, and a temperature control medium controlled to a predetermined temperature by the chiller 93 is supplied to the temperature control chamber 91 through the temperature control medium supply line 92. A supply line 94 for circularly supplying the temperature control medium in the temperature control chamber 91 to the chiller 93 is provided in the temperature control chamber 91. In FIG. 10, reference numerals 95 and 96 denote a temperature detection unit and a flow rate control valve, respectively. In the present embodiment, the temperature control chamber 91, the temperature control medium supply line 92 and the chiller 93 forms a temperature control unit for controlling a temperature of $CO_2$ gas.

As can be clearly seen from the test examples to be described later, the size of the gas cluster 200 is correlated with the temperature of the cleaning gas ($CO_2$ gas) supplied to the pressure chamber 41. As the gas temperature is decreased, the size of the gas cluster 200 is increased. Therefore, in this example, the size of the gas cluster 200 is determined in accordance with the diameter of the particle 100 on the surface of the wafer W and, then, the chiller 93 is controlled to correspond to the determined size. In other words, the temperature of the temperature control medium in the temperature control medium circulation path, e.g., the supply line 94, is detected by the temperature detection unit 95. The temperature of the temperature control medium is controlled by the chiller 93 based on the detection value, and the temperature control medium of the controlled temperature is circulated around the nozzle unit 4 and the gas supply unit 6. In this manner, in the second embodiment, the gas cluster size is controlled by adjusting the temperature of $CO_2$ gas. The temperature of $CO_2$ gas may be adjusted by controlling the supply amount of the temperature control medium by controlling the opening degree of the flow rate control valve 96.

In the present embodiment as well as the first embodiment, the gas clusters 200 having sizes controlled in accordance with the diameters of the particles 100 are irradiated to the particles 100, so that the performance of removing the particles 100 adhered to the wafer W can be improved. The gas clusters 200 are perpendicularly irradiated to the wafer W, so that the particles 100 in the recesses 81 can be removed at a high removal rate. In the present invention, the acceleration of the gas clusters 200 may be controlled by the mixing ratio of $CO_2$ gas and He gas. He gas hardly generates clusters and increases the speed of the clusters generated by the $CO_2$ gas when He gas is mixed with $CO_2$ gas. Therefore, when the amount of He gas mixed with the $CO_2$ gas is increased, the acceleration of the gas clusters 200 is increased. Accordingly, proper mixing ratios of He gas may be obtained in advance on the basis of gas cluster sizes and the mixing ratio of He gas may be controlled to the predetermined level during the cleaning of particles. For example, the control unit 7 may have data on correlation between a mixing ratio of $CO_2$ gas and He gas and a gas cluster size, the flow rate of $CO_2$ gas being fixed, and controls the mixing ratio (e.g., the flow rate of He gas) in accordance with the gas cluster size.

Further, the size of the gas cluster may be controlled by controlling both of the pressure of the cleaning gas and the temperature of the cleaning gas.

Hereinafter, a third embodiment of the present invention will be described with reference to FIG. 11. In the third embodiment, gas clusters are ionized and accelerated by an acceleration voltage. Between the nozzle unit 4 and the mounting unit 32, a differential gas exhaust unit 51, an ionization unit 52, an acceleration unit including an acceleration electrode 53, and a magnet 54 are provided in that order from the nozzle unit 4 side. The differential gas exhaust unit 51 has a skimmer 51a and a separation plate 51b having at a center thereof an opening through which a cluster beam passes. A region between the skimmer 51a and the separation plate 51b is exhausted by a dedicated vacuum pump (not shown) and set to a high vacuum state.

The ionization unit 52 has a filament, an anode 52a and a drawing electrode 52b. By applying an ionizing voltage between the filament and the anode 52a, the clusters passing through the anode 52a are ionized by collision with electrons. A negative potential is applied from the DC power supply 52c to the drawing electrode 52b, so that cluster ions are drawn. The acceleration electrode 53 is connected to a voltage variable DC power supply 55. The acceleration electrode 53 has an acceleration voltage by the application of a positive high voltage with respect to the potential of the wafer W, and accordingly the cluster ions are accelerated toward the wafer W. Therefore, the mounting table 32 serves as, e.g., a ground potential. The magnet 54 removes monomer ions included in the cluster ions.

In the third embodiment as well as the device shown in FIG. 3 (non-ionization type), the factor related to the cluster size is controlled in accordance with the particle information. However, when higher kinetic energy is required, the kinetic energy can be increased by accelerating the gas clusters by the ionization unit provided below the nozzle unit 4. Therefore, the DC voltage (acceleration voltage) is controlled by the control unit 7, and the optimal cluster energy can be obtained. Further, a desired acceleration voltage may be obtained in advance on the basis of cluster sizes, for example, and the acceleration voltage may be controlled to the predetermined level during the cleaning of the particles.

Further, a plurality of nozzle units may be provided for each particle size. Such a case may be applied to the device shown in FIG. 3 (non-ionization type) or the device shown in FIG. 11 (ionization type). In such a configuration, for example, the particle size is set to two levels (Pα and Pβ). The gas clusters are irradiated from one of the nozzle units to particles having the particle size Pα under the irradiation condition suitable for the removal of the particles having the particle size Pα. Further, gas clusters are irradiated from the other nozzle unit to particles having the particle size Pβ under the irradiation condition suitable for the removal of the particles having the particle size Pβ. Accordingly, the particles are removed. Alternatively, particles of different diameters may be removed by each of the nozzle units.

Figure 12:
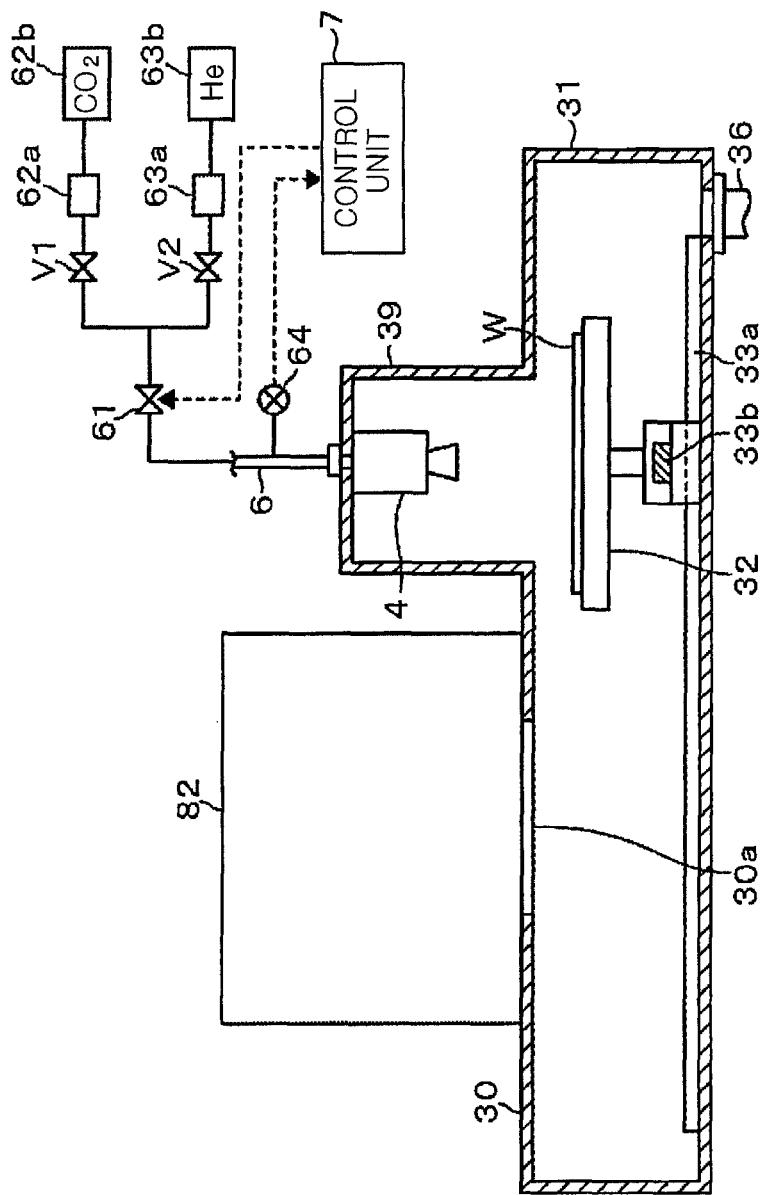
FIG. 12 is a vertical side view of a substrate cleaning device in accordance with a fourth embodiment of the present invention.

Hereinafter, a fourth embodiment of the present invention will be described. In this embodiment, the wafer inspection unit is connected to the vacuum transfer chamber 2. In this case, for example, the wafer inspection unit 17 may be combined with the cleaning module 3 as shown in FIG. 12. In the example shown in FIG. 12, the cleaning chamber 31 is also used as the inspection chamber. An accommodating member 82 accommodating therein the wafer inspection device is provided on the top wall 30 of the cleaning chamber 31 and near the protruding portion 39. In FIG. 12, a reference numeral 30a denotes an inspection opening formed in the top wall 30, and a space below the opening 30a serves as an inspection region. In this example, the mounting table 32 is positioned at the inspection region below the accommodating member 82, and the particles are inspected through the opening 30a. Then, the mounting table 32 is positioned below the protruding portion 39, and the particles are removed.

TEST EXAMPLES

Next, test examples performed to examine the effects of the present invention will be described.

Test Example 1: Relationship Between Kinetic Energy and Particle Removal Rate

Figure 11:
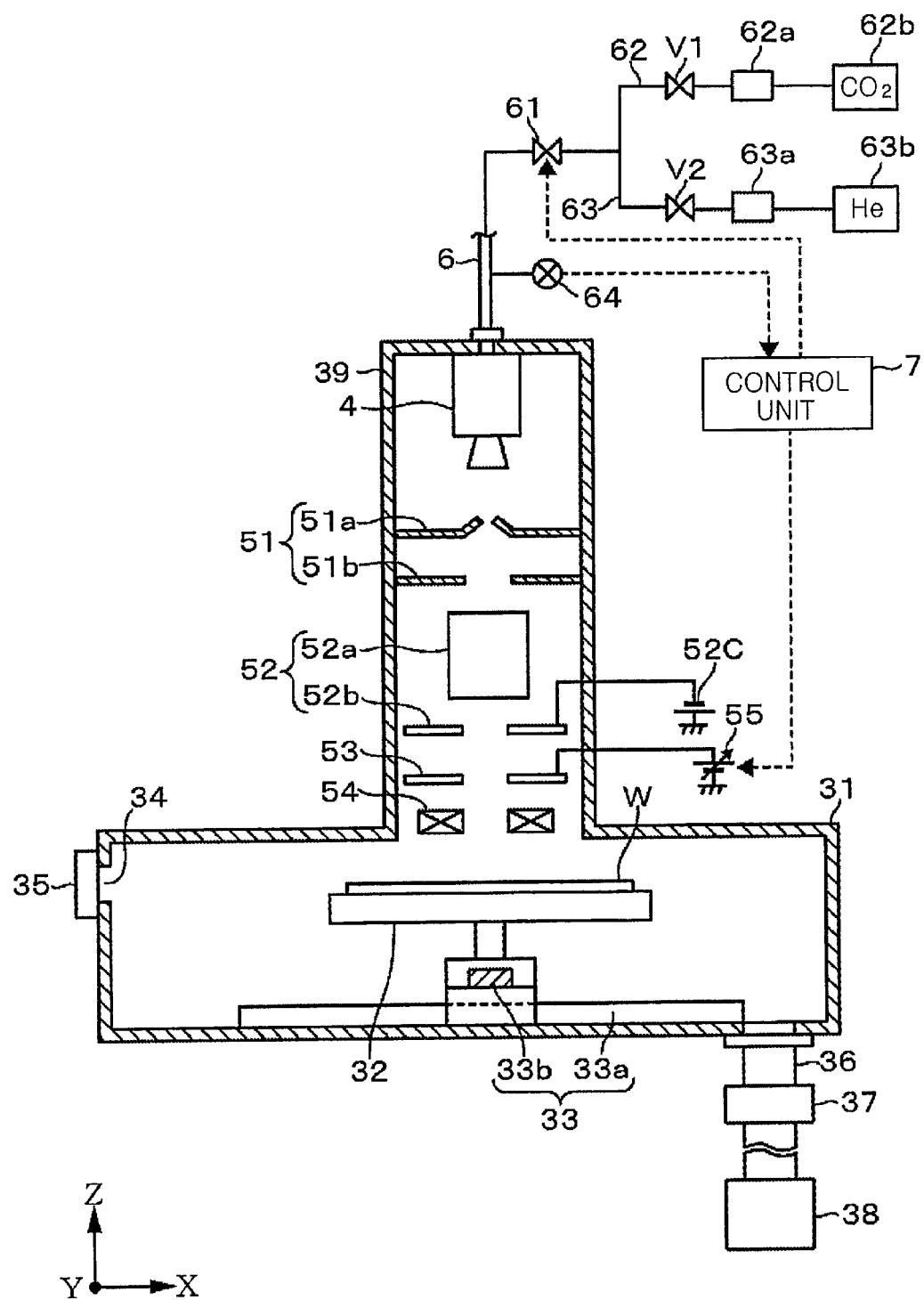
FIG. 11 is a vertical side view of a substrate cleaning device in accordance with a third embodiment of the present invention.

In the cleaning module 3 shown in FIG. 11, when performing the particle removal process by using gas clusters of $CO_2$ gas, the particle removal rate was evaluated while varying kinetic energy. At this time, a processing condition was set as follows, and the kinetic energy was varied by controlling a voltage (acceleration voltage) applied to the acceleration electrode 53. Next, the number of particles was detected by monitoring a wafer surface by using the SEM before and after cleaning to obtain the removal rate.

Figure 13:
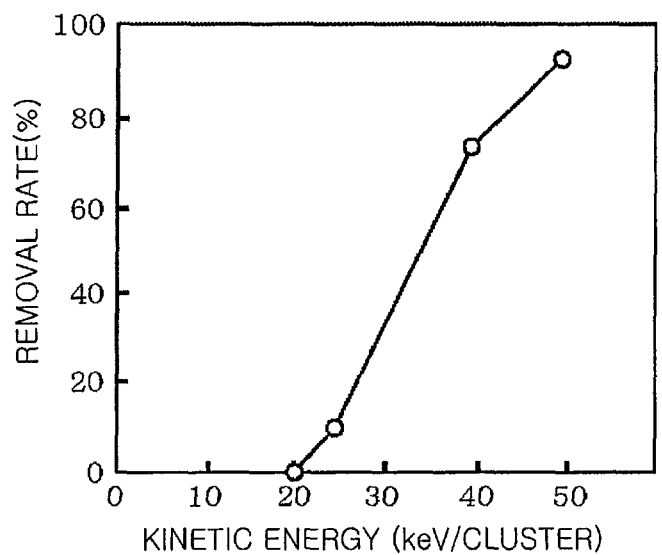
FIG. 13 is a characteristic view showing relationship between a particle removal rate and kinetic energy.

Cleaning target substrate: single crystal silicon wafer
Supply pressure of $CO_2$ gas into pressure chamber: 2.0 MPa
Irradiation angle θ of gas cluster: 90°
Irradiation amount of gas cluster: $3\times10^{14}/cm^2$
Particle: $SiO_2$ having a particle diameter of 23 nm The results are shown in FIG. 13. As will be described later, the kinetic energy of the gas clusters is not fixed. In FIG. 13, the horizontal axis represents the kinetic energy with a peak intensity and the vertical axis represents a particle removal rate. The kinetic energy referred in the following test examples indicates kinetic energy with a peak intensity. It is clear from FIG. 13 that the kinetic energy and the particle removal rate are positively correlated and the removal rate is increased as the kinetic energy is increased. At this time, it has been confirmed that when the cluster had a kinetic energy of 50 keV, the removal rate was 92%. From this, it is clear that by setting the kinetic energy to 50 keV/cluster, a sufficient force to peel off $SiO_2$ particles having a particle diameter of 23 nm can be obtained. Here, the gas clusters having a kinetic energy of 50 keV/cluster were irradiated to the wafer W having a pattern formed thereon and the pattern was monitored by the SEM. As a monitoring result, it was found that there was no damage.

When the kinetic energy was 25 keV/cluster, the removal rate of particles ($SiO_2$ particles) having a diameter of 23 nm was about 11%. Therefore, it is expected that the removal rate of 90% or above can be acquired by setting the irradiation amount to be ten times greater than $3\times10^{14}/cm^2$. From the above, the present inventors have found that it is preferable to set the irradiation amount of the gas cluster per 1 $cm^2$ in order of $10^{15}$ or less.

Test Example 2: Removal of Particles in Pattern

In the cleaning module 3 shown in FIG. 11, the particles in a pattern were removed by the gas clusters of $CO_2$ gas and a particle removal rate was evaluated. At this time, a processing condition was set as follows, and removal efficiency was evaluated by monitoring a wafer surface by the SEM before and after cleaning.

Figure 14A:
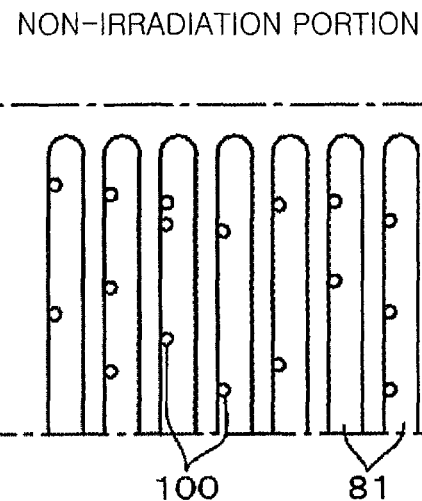
FIGS. 14A and 14B are top views showing a part of a surface of a wafer before and after irradiation of gas cluster.
Figure 14B:
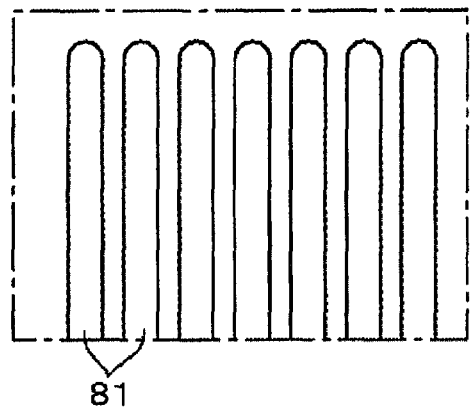

Supply pressure of $CO_2$ gas into pressure chamber: 2.0 MPa
Irradiation angle of gas cluster: 90°
Irradiation amount of gas cluster: $3\times10^{14}/cm^2$
Cluster kinetic energy: 40 keV/cluster
Particle: $SiO_2$ having particle diameter of 23 nm
Pattern: 80 mL/S FIGS. 14A and 14B show traced images of a part of a pattern captured by the SEM. FIG. 14A shows a state of a portion before the gas clusters are irradiated thereto, and FIG. 14B shows a state of the portion after the gas clusters have been irradiated thereto. In the gas cluster non-irradiation portion, there were the particles 100 on the bottom portion or the side surfaces of the recesses 81 of the pattern. On the contrary, in the gas cluster irradiation portion, there were no particles 100. Accordingly, it was recognized that the particles 100 in the recesses 81 of the pattern were removed at a high removal rate by setting the supply pressure of $CO_2$ gas to 2.0 MPa, setting the kinetic energy of the gas clusters to 40 keV/cluster and irradiating the gas clusters perpendicularly to the wafer W.

Test Example 3: Relationship Between Gas Cluster Size and Pressure

In the cleaning module 3 shown in FIG. 11, the gas clusters of $CO_2$ gas were generated at various supply pressures of the $CO_2$ gas supplied to the pressure chamber 41, and the gas cluster sizes were evaluated. At this time, the supply pressure of the $CO_2$ gas was set to 1 MPa, 2 MPa and 4 MPa, and the cluster size distribution, i.e., the relationship between the number of constituent molecules of the clusters and intensity, was obtained by using a time-of-flight method and a theoretical formula. The intensity indicates the number of clusters having the number of constituent molecules.

The time-of-flight method is a mass selection method using a feature that ions accelerated by the same energy have different flight velocities depending on mass. On the assumption that a mass of ion is m, an acceleration voltage is Va, charge of ion is q and a flight distance is L, flight time t of ion is calculated by the following equation. Since L and Va are known values, m/q can be obtained by measuring t. Specifically, the gas clusters are ionized and a current is detected by an MCP detector provided at a cluster irradiation region.

$$t=Lx\{m/(2qVa)\}^{1/2}$$

Figure 15:
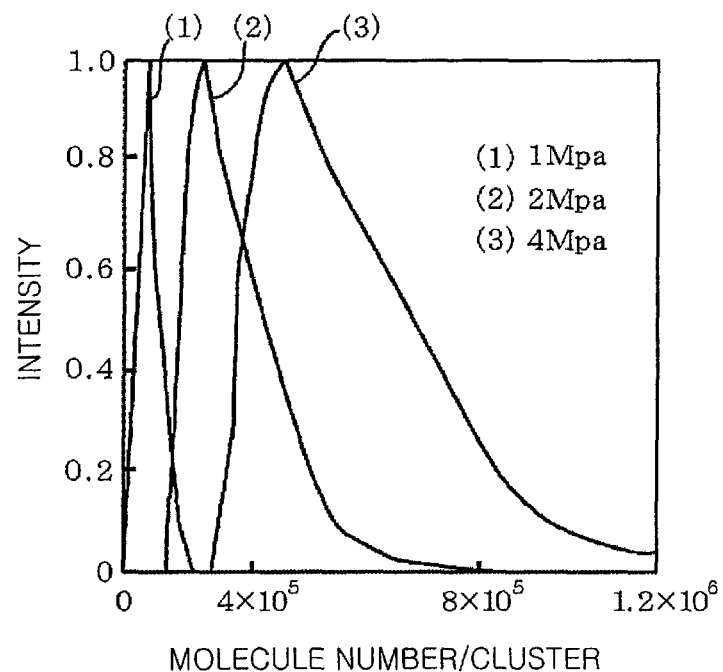
FIG. 15 is a characteristic view showing relationship between the number of molecules of a gas cluster and a pressure.

The result thereof is shown in FIG. 15. In FIG. 15, the horizontal axis represents the number of $CO_2$ molecules forming a single gas cluster, and the vertical axis represents the intensity. As the supply pressure of $CO_2$ gas is increased, the intensity distribution and the peak value are shifted toward a direction in which the number of molecules forming a single gas cluster is increased. When the number of molecules forming a single gas cluster is increased, the cluster size is increased. Therefore, the gas cluster size can be controlled by the gas pressure.

Test Example 4: Removal Performance Depending on Particle Diameter

In the cleaning module 3 shown in FIG. 11, the particle removal process was performed for the various particle diameters by using gas clusters of $CO_2$ gas, and the particle removal rate was evaluated. At this time, there were used four substrates (bare wafers) to which particles having diameters of 12 nm, 23 nm, 49 nm, and 109 nm were adhered, and the particle removal rate was evaluated while setting the size of the gas cluster to 26 nm. Processing conditions were set as follows, and the evaluation was carried out while setting a different kinetic energy for each substrate. The particle removal rate was obtained by monitoring the wafer surfaces by using the SEM before and after cleaning.

Figure 16:
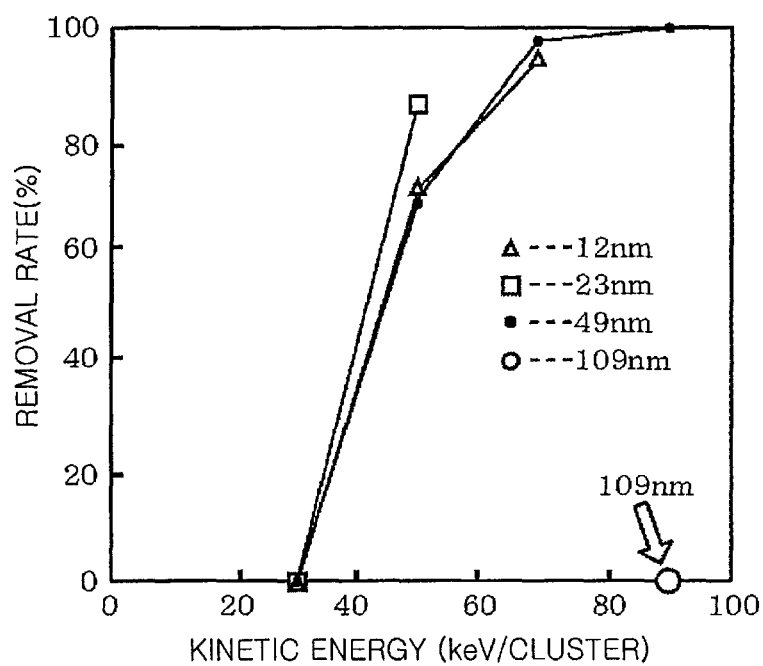
FIG. 16 is a characteristics diagram showing relationship between a particle removal rate and kinetic energy.

Cleaning target substrate: single crystal silicon wafer
Supply pressure of $CO_2$ gas into pressure chamber: 2.0 MPa
Irradiation angle of gas cluster: 90°
Irradiation amount of gas cluster: $3\times10^{12}/cm^2$ The results are shown in FIG. 16. In FIG. 16, the horizontal axis represents the kinetic energy, and the vertical axis represents the particle removal rate. Data of the particles having diameters of 12 nm, 23 nm, 49 nm and 109 nm are plotted as ∆, □, ●, and ○, respectively. From this, in the case of the particles having diameters of 12 nm, 23 nm and 49 nm, it was found that the particle removal rate was improved as the kinetic energy was increased and, the particle removal rate of about 70% or above can be acquired by setting the kinetic energy to 50 keV/cluster or above. On the other hand, in the case of the particles having a diameter of about 109 nm, the particles cannot be completely removed even by applying high kinetic energy of 90 keV/cluster. Therefore, if gas clusters having relatively excessively smaller sizes than the particle sizes are used, the particles cannot be removed. This proves that it is effective to use gas clusters having a size corresponding to the particle diameter. Further, it is preferable to set the gas cluster size (diameter) to be 0.2 to 2 times the particle size (diameter).

According to this test example, when the irradiation amount of the gas cluster is $3\times10^{12}/cm^2$, the particles having sizes of 12 nm, 23 nm, and 49 nm can be removed. The following can be understood based on a mechanism that the irradiation of gas clusters to the vicinity of particles can result in removal of the particles and a fact that a plurality of particles near the irradiation point can be removed. Specifically, when the irradiation amount of gas clusters per 1 $cm^2$ is in order of $10^{11}$ or above, the particles of the above sizes can be removed. Meanwhile, the increase in the irradiation amount of the gas clusters leads to the increase in the number of gas clusters irradiated to the particles, so that the particles can be effectively removed. Accordingly, in accordance with the result of the test example 1, the particles smaller than or equal to 49 nm or less can be effectively removed by setting the irradiation amount of gas clusters per 1 $cm^2$ to in order of $10^{11}$ to $10^{15}$.

Test Example 5: Relationship Between Gas Cluster Size and Temperature

Figure 17:
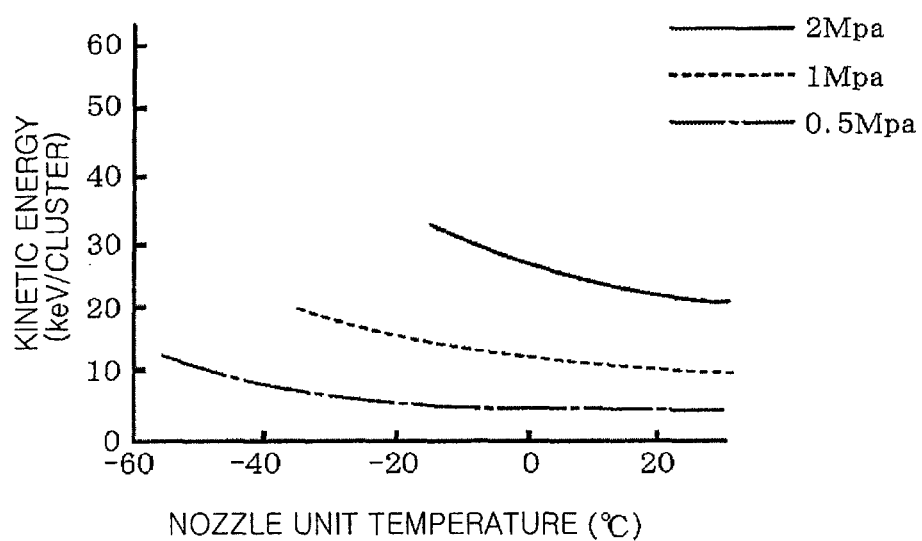
FIG. 17 is a characteristic diagram showing relationship between the number of molecules of a gas cluster and a temperature.

FIG. 17 shows relationship between a temperature of the nozzle unit 4 and kinetic energy of the gas clusters at different pressures in the case of generating gas clusters of $CO_2$ gas. When the temperature of the nozzle unit 4 is decreased, the kinetic energy of the gas clusters is increased and, hence, the gas cluster size is increased. Accordingly, the gas cluster size can be controlled by adjusting the gas temperature.

What is claimed is:

1. A substrate cleaning method for removing particles adhered to a substrate, comprising:
  acquiring particle information including diameters and positions of the particles adhered to the substrate to create a data table comprising a plurality of different datasets comprising:
    a first dataset comprising a first particle size diameter range, first particle positions of particles within said first particle size diameter range, and a first gas pressure control valve opening value of a cleaning gas; and
    a second dataset comprising a second particle size diameter range, second particle positions of particles within said second particle size diameter range, and a second gas pressure control valve opening value of the cleaning gas, wherein said first and second datasets are different;
  performing, for each respective dataset of said data table, the following:
    moving said substrate to a respective irradiation position based on a particle position of said respective dataset;
    controlling a pressure of the cleaning gas depending on the gas pressure control valve opening value of said respective dataset wherein the pressure determines a size of a gas cluster, which comprises aggregates of atoms or molecules of the cleaning gas;
    ejecting the cleaning gas at said pressure, which is at a higher pressure than a processing atmosphere where the substrate is provided, to the processing atmosphere wherein the gas cluster is generated by adiabatic expansion; and
    removing the particles at said respective irradiation position by irradiating the gas cluster to a surface of the substrate at an angle of 90°±15°.

2. The substrate cleaning method of claim 1, wherein the substrate has on the surface thereof pattern recesses.

3. The substrate cleaning method of claim 1, wherein in said acquiring the particle information, the particle information is stored in a storage unit for use in a computer; and
  in said controlling, the computer outputs a control signal based on the particle information stored in the storage unit.

4. The substrate cleaning method of claim 1, wherein an irradiation amount of the gas cluster is in the order of $10^{11}$ to $10^{15}$ per 1 $cm^2$.

5. The substrate cleaning method of claim 1, wherein in said controlling the pressure of the cleaning gas and a temperature of the cleaning gas are controlled.

6. The substrate cleaning method of claim 1, wherein the particle information includes a position and a diameter of each of the particles adhered to the substrate.

7. The substrate cleaning method of claim 1, wherein the cleaning gas is either $CO_2$ gas or a gaseous mixture of $CO_2$ gas and He gas.

8. The substrate cleaning method of claim 1, wherein the cleaning gas is ejected at a pressure ranging about from 0.3 MPa to 5.0 MPa.

* * * * *